United States Patent
Greer et al.

(10) Patent No.: US 10,014,228 B2
(45) Date of Patent: Jul. 3, 2018

(54) METHOD AND APPARATUS TO ASSIST THE PROCESSING OF DEFORMED SUBSTRATES

(71) Applicant: Rudolph Technologies, Inc., Flanders, NJ (US)

(72) Inventors: James H. Greer, Norwood, MA (US); Troy Palm, Eden Prairie, MN (US)

(73) Assignee: Rudolph Technologies, Inc., Flanders, NJ (US)

( * ) Notice: Subject to any disclaimer, the term of this patent is extended or adjusted under 35 U.S.C. 154(b) by 282 days.

(21) Appl. No.: 14/944,839

(22) Filed: Nov. 18, 2015

(65) Prior Publication Data

US 2016/0148831 A1     May 26, 2016

Related U.S. Application Data

(60) Provisional application No. 62/083,577, filed on Nov. 24, 2014.

(51) Int. Cl.
| | |
|---|---|
| H01L 21/66 | (2006.01) |
| H01L 21/683 | (2006.01) |
| H01L 21/687 | (2006.01) |
| H01L 21/67 | (2006.01) |
| H01L 21/673 | (2006.01) |

(52) U.S. Cl.
CPC ........ H01L 22/12 (2013.01); H01L 21/67288 (2013.01); H01L 21/6838 (2013.01); H01L 21/68728 (2013.01); *H01L 21/673* (2013.01); *H01L 21/67346* (2013.01); *H01L 21/6875* (2013.01); *H01L 21/68714* (2013.01); *H01L 21/68721* (2013.01)

(58) Field of Classification Search
CPC ................ H01L 22/12; H01L 21/6875; H01L 21/68728; H01L 21/6838; H01L 21/68714; H01L 21/68721; H01L 21/67288; H01L 21/67346; H01L 21/673; H01L 21/687; H01L 21/683
See application file for complete search history.

(56) References Cited

U.S. PATENT DOCUMENTS

| | | | | |
|---|---|---|---|---|
| 4,577,095 A | * | 3/1986 | Watanabe | G03F 9/7026 250/201.2 |
| 5,692,873 A | * | 12/1997 | Weeks | G03F 7/70691 204/298.15 |
| 6,446,948 B1 | * | 9/2002 | Allen | B25B 11/005 118/500 |
| 7,396,022 B1 | * | 7/2008 | Moghadam | B23B 31/307 118/500 |
| 7,826,068 B2 | * | 11/2010 | Czerkas | G01B 21/045 356/237.2 |
| 8,336,188 B2 | * | 12/2012 | Monteen | H01L 21/6838 269/21 |
| 9,022,392 B2 | * | 5/2015 | Jang | H01L 21/6838 279/3 |
| 9,105,516 B2 | * | 8/2015 | Nakamura | B24B 37/30 |

(Continued)

*Primary Examiner* — David Zarneke
(74) *Attorney, Agent, or Firm* — Chiesa Shahinian & Giantomasi PC (57) ABSTRACT

A method and apparatus for detecting and handling deformed substrates, thus allowing them to be processed, and for increasing device yield on the substrate is herein disclosed. A sensor detects deformity, then the substrate is flattened, allowing a support to hold it securely.

18 Claims, 5 Drawing Sheets

(56) References Cited

U.S. PATENT DOCUMENTS

| | | | | |
|---|---|---|---|---|
| 9,576,827 B2* | 2/2017 | Liu | ............ | H01L 25/50 |
| 9,793,152 B2* | 10/2017 | Rudmann | ............ | H01L 21/6838 |
| 2013/0175005 A1* | 7/2013 | Gowdaru | ............ | F28F 3/00 |
| | | | | 165/84 |
| 2013/0330154 A1* | 12/2013 | Sowden | ............ | H01L 21/67253 |
| | | | | 414/222.02 |
| 2015/0233841 A1* | 8/2015 | Bobrov | ............ | H01L 22/12 |
| | | | | 356/237.5 |

* cited by examiner

METHOD AND APPARATUS TO ASSIST THE PROCESSING OF DEFORMED SUBSTRATES

CROSS REFERENCE TO RELATED APPLICATION

This application claims the benefit of U.S. Provisional Application No. 62/083,577, filed Nov. 24, 2014, the disclosure of which is herein incorporated by reference.

TECHNICAL FIELD OF THE INVENTION

The present invention relates generally to a mechanism to retain a substrate on a support, and in particular to a mechanism for securing a deformed substrate, such as a wafer, on a top plate to allow for uniform processing of semiconductor and microelectronic devices.

BACKGROUND OF THE INVENTION

Manufacturers of semiconductor devices, to increase the production capacity of their factories, work to maximize device yield per wafer. That is, their goal is to maximize the number of working devices built on each substrate wafer. Each step in the manufacturing process must be made to occur uniformly at locations across the surface of the substrate, thus allowing for uniform device construction.

Ideally, a substrate used in the formation of semiconductor devices is substantially flat and remains so as it is altered throughout the device formation process. However, it is common in the modern processing environment for a substrate to arrive at a processing step in a state of being, for example, bent, bowed, rippled, warped, or otherwise deformed. This deviation from planarity may occur because the various layers processed into or onto the original substrate have differing compositions. Thus, they react differently to the processing steps, expanding or contracting by various amounts. The layers can pull against each other, causing the substrate to deform. This prevents uniform film deposition, polishing, and lithographic exposure across the substrate surface.

Some modern vacuum chucks attempt to address this problem by pulling the raised portions of the substrate down against the chuck using vacuum pressure drawn through an array of holes in the surface of the chuck. In some cases, attempts are made to "smooth" deformed substrates over the chuck's surface by successively pulling adjacent sections of the substrate down. However, the substrate is sometimes too deformed for adequate vacuum pressure to form between it and the chuck, preventing the substrate from being secured to the chuck.

The prior art also includes clamps that secure a substrate for manipulation during processing, but these clamps are configured for flat and somewhat rigid substrates. They do not address the problem of deformation seen especially in thin substrates which typically lack rigidity.

Accordingly, there is a need for a substrate handling mechanism which is able to accept a warped substrate and make it lay flat against an underlying surface for processing.

SUMMARY OF THE INVENTION

The problem of processing a deformed substrate is solved by use of a sensor to detect the presence of substrate deformity, then applying a force to the top surface of the deformed substrate to retain the substrate flat against a substrate support. However, if the detected deformity is below an experimentally or theoretically determined threshold, the substrate may continue through the processing step without application of the top-down force. This eliminates the need for an operator to detect deformity on a substrate-by-substrate basis.

Once a substrate is determined to be deformed, a substrate handling apparatus applies force to the substrate that is great enough to deflect the substrate toward the support, but small enough to prevent damage to the substrate and any structures on it.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
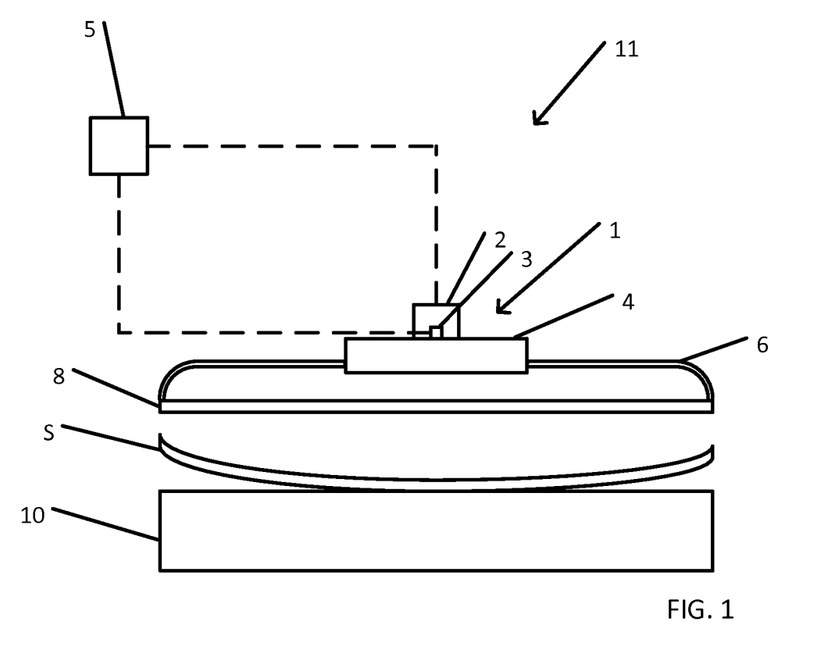
FIG. 1 is a schematic side view of one embodiment of a substrate handling mechanism having a retention portion in the form of a ring and positioned in a state of being out of contact with a deformed substrate on the substrate support.

FIG. 1 represents an illustrative embodiment of a substrate handling apparatus 11 and a deformed substrate S positioned on a substrate support 10. The substrate support 10, often referred to as a chuck or top-plate, is configured to support and secure a substrate S for processing. In this embodiment, the substrate S is of a type often used in the processing or fabrication of semiconductor devices, and can be made of, for example, silicon, gallium-arsenide, sapphire, a moldable material such as plastic or epoxy, a composite of a moldable material and pre-formed IC devices, or of any other useful material. The substrate S may be discoid, irregular, square, rectangular, or any suitable shape or size. It is understood that a deformed substrate S may be difficult to secure on a support 10 using vacuum pressure alone. There may exist large gaps between portion(s) of the substrate S and the surface of support 10 that prevent the build-up of vacuum pressure between substrate S and support 10. Accordingly, apparatus 11 includes retention portion 8 configured to guide or force substrate S toward or into contact with support 10.

Apparatus 11 includes an actuator assembly 1 having a mount 4 coupled to flexures 6 and actuator 2. Actuator 2 is configured to move the retaining portion 8 between a first position or state in which it is above or at least out of contact with the substrate S, and a second position or state in which it is in contact with the substrate S. In FIG. 1, retention portion 8 is shown to be in the first position. Actuator 2 may be a mechanical, pneumatic, or electric actuator, or any other mechanism useful for moving the retaining portion 8 between the first and second states. The actuator 2 is coupled to the retaining portion 8 via a mount 4 and flexures 6. (See FIG. 3). Mount 4 may be a bracket, mounting block, or any structure suitable for coupling flexures 6, and thereby retaining portion 8, to actuator 2. The flexures 6 may be arms, bars, or the like, configured to have a stiffness that allows them to limit and/or mitigate the contact of retention portion 8 with substrate S, and may be have any number, profile, and arrangement that suitably secures the retaining portion 8 to the mount 4.

Substrate handling apparatus 11 may include a sensor 3 configured to capture information about the geometry or profile of the substrate, and may be, for instance, a profilometer for measuring the surface of substrate S or a pressure sensor for measuring the vacuum pressure between substrate S and substrate support 10, as described below. Sensor 3 may be an optical profilometer that uses interferometry, microscopy, laser triangulation, or any other optical profilometry or position-sensing method known to those skilled in the art to measure the surface profile of substrate S, or to otherwise characterize the deviation of substrate S from the planar surface of support 10. Sensor 3 is shown to be positioned on mount 4, but may have any position suitable to the sensor-type used and the application, and may have a position remote to actuator assembly 1.

While it is preferred to use optical techniques that minimize or avoid contact with a substrate, contact type profilometers may be used to assess the magnitude of a substrate's S deformity. Note that in these instances it is desirable to contact the substrate in so-called "dead" areas such as, among others, at the edge bead removal area where possibly viable IC devices are not located. Sensor 3 may be addressed to the substrate S at a normal or oblique incidence, and from a working distance suitable to the sensor in question. In some instances the mount 4 and/or flexures 6 may have apertures or openings therein or there between that permit access by the sensor 3 to the substrate S. In other instances the retaining portion 8 may be positionable sufficiently far away from the substrate S to permit more or less direct access to the substrate S.

Information about the geometry of the substrate S may be processed by onboard processors in the sensor 3 or alternatively, information regarding the geometry of the substrate S may be transmitted to the controller 5, which then determines what action is to be taken, if any, by the apparatus 11. A controller 5 may be in wired or wireless communication with sensor 3, and is configured to receive data from sensor 3 indicating the planarity of substrate S. Controller 5 may run algorithmic software comparing the sensor data to empirically or theoretically determined values to determine if the substrate S is too deformed to be retained on support 10 without use of retaining portion 8 to direct substrate S toward support 10. Controller 5 may be in wired or wireless communication with actuator 2, and may be configured to direct actuator 2 to move retention portion 8 to engage substrate S if determined to be required by sensor 3 or controller 5. Controller 5 includes logic, memory, and input/output circuitry for issuing control signals, for receiving information from the apparatus 11, and for processing and reporting data for use in managing the apparatus 11 and the fabrication process in general. The controller 5 may be a standalone computer or a networked or distributed system.

Figure 2:
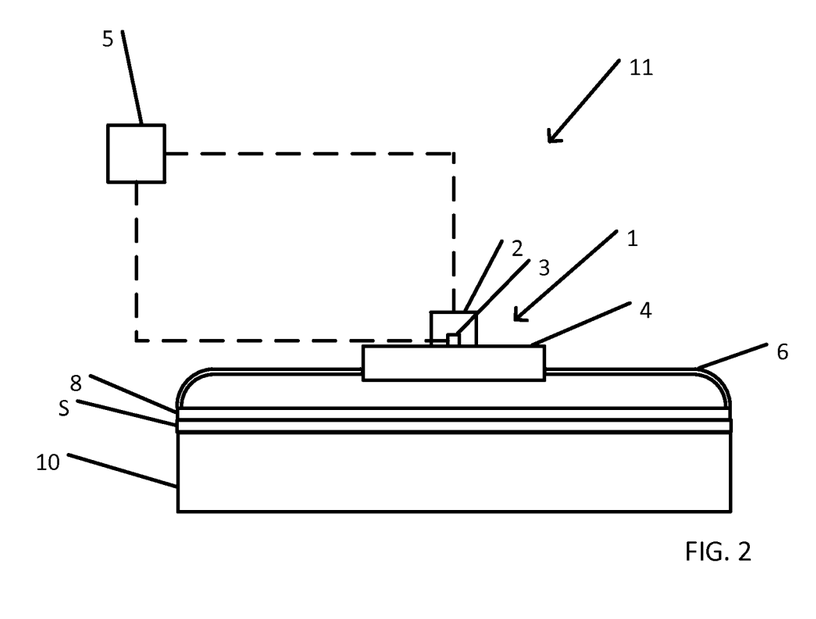
FIG. 2 is a schematic side view of the substrate handling mechanism of FIG. 1 wherein the retention portion is positioned in a state of being in contact with the substrate on the substrate support.

FIG. 2 illustrates the apparatus 11 with retention portion 8 in the second position, i.e., in contact with and exerting a non-zero force against at least one portion of the substrate S. In some embodiments, the retaining portion 8 and/or the flexures 6 are elastic, and the spring equations that characterize retaining portion 8 and flexures 6 limit the magnitude of force that is exerted on a substrate S for a given movement of the actuator 2. Actuator 2 causes the retaining portion 8 to apply a constant or variable amount of force to the substrate S that has been empirically or theoretically derived to not exceed a bending strength of the substrate. Retaining portion 8 makes contact with the substrate S with a force large enough to deflect the substrate S toward the support 10, but not so large as to damage the substrate S or any structures on the surface of substrate S. At a minimum, a sufficient portion of the substrate S is brought close enough to support 10 to allow a mechanism of support 10 (not shown) configured to fix, hold, or secure substrate S to support 10 to engage effectively. The fixing mechanism may use vacuum pressure, as described below, or electro-static, mechanical clamping, or any other suitable fixing mechanism or methodology.

Figure 3:
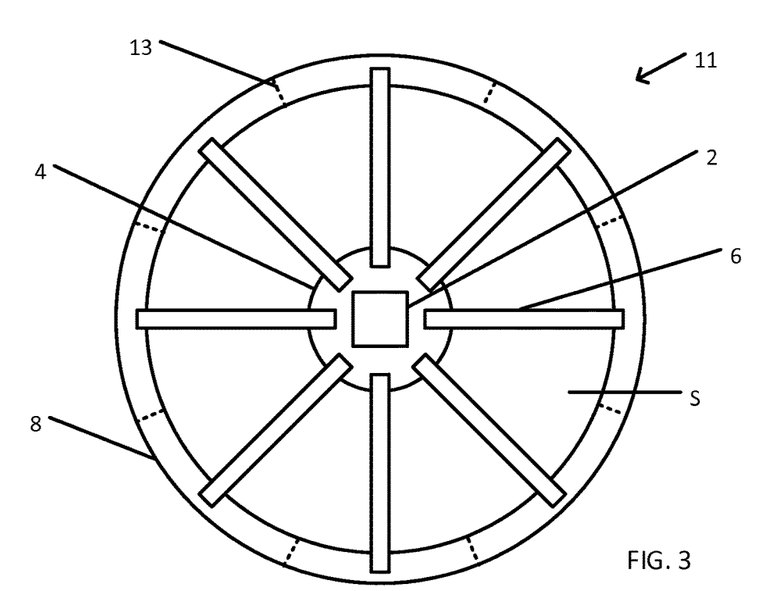
FIG. 3 is a schematic top-down representation of the substrate handler of FIG. 1.

FIG. 3 shows an illustrative embodiment in which retention portion 8 is in the shape of a ring, and is configured to engage at least a portion of the periphery of substrate S. A plurality of flexures 6 are attached to mount 4 and extend radially to retention portion 8, thereby coupling retention portion 8 to actuator 2. Flexures 6 may be attached to mount 4 and retention portion 8 by welding, screws, or any suitable fastening method. Alternatively, retaining portion 8 may be formed of individual segments 13 (defined by the dashed lines in FIG. 3) wherein each segment 13 is coupled to mount 4 by at least one of the plurality of flexures 6, and is thereby allowed some independence of motion when engaging substrate S. Retaining portion 8 is shown to have a single ring, but may include at least a second ring of a different circumference allowing retaining portion 8 to engage substrates of various sizes.

Figure 4:
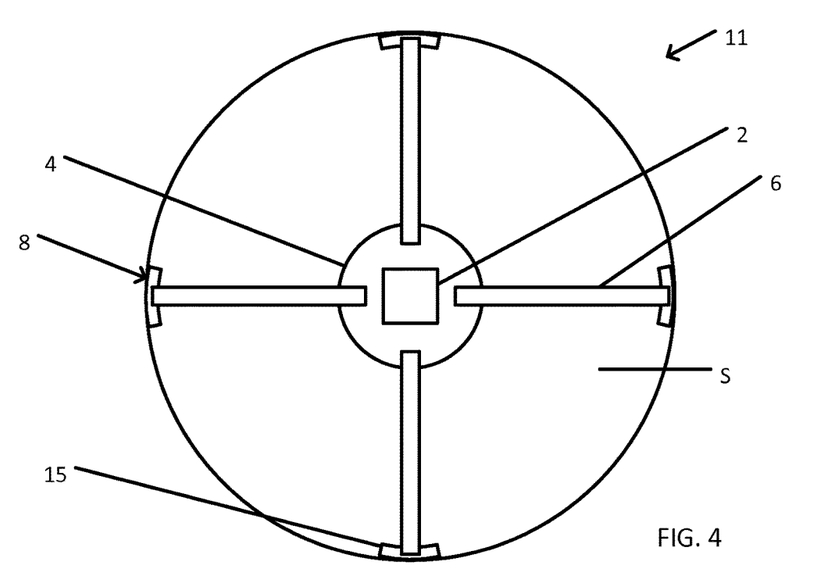
FIG. 4 is a schematic top-down representation of another embodiment of the substrate handler wherein the retention portion comprises a plurality of contacts, each in contact with a peripheral region of the substrate.
Figure 5:
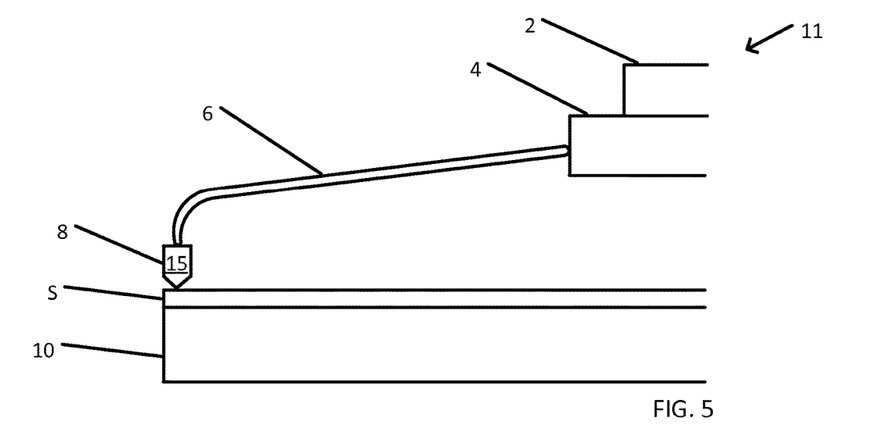
FIG. 5 is a schematic side view of an embodiment of a pressure member contact of FIG. 4.

Physical contact may damage substrate S, thus, it is desirable to minimize such contact. In the embodiment shown in FIG. 4, the retaining portion 8 is made up of a plurality of contacts 15. Each contact 15 engages a corresponding portion of the periphery of substrate S, thus, the total area of contact on substrate S is reduced compared to the embodiment shown in FIG. 3. Four contacts 15 are shown, but any number of contacts 15 may be used to retain substrate S on support 10. By limiting the surface area on substrate S that is contacted by the retaining portion 8, damage to the substrate S caused by the retaining portion 8 is minimized. Contacts 15 may be frustoconical, shaped as arcs, or otherwise formed to minimize the area of contact with the substrate S. FIG. 5 shows a schematic side view of a contact 15 of retaining portion 8 in contact with the substrate S. In some embodiments, the retaining portion 8 may be arranged to contact an edge of a wafer at what is referred to as an edge bevel surface or even an edge normal surface. Any useful arrangement may be substituted for the foregoing.

Figure 6:
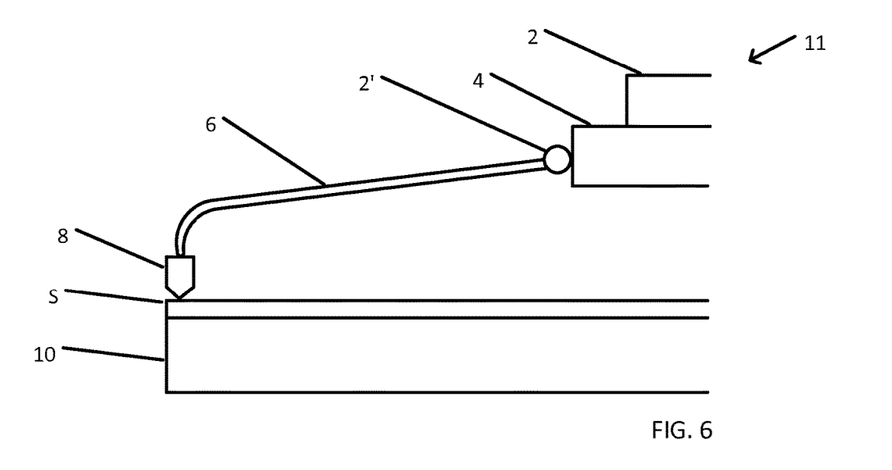
FIG. 6 is a schematic side view of an embodiment of a substrate handler having individually controllable contacts.

In the embodiment shown in FIG. 6, retaining portion 8, including either segment 13 or contact 15, is coupled to an actuator 2' by flexure 6. Actuator 2' may be coupled to mount 4, and may move retaining portion 8 between a first position in which retaining portion 8 is out of contact with substrate S (not shown), and a second position in which retaining portion 8 is in contact with substrate S. Mount 4 may be stationary or movable by actuator 2. Actuator 2' may be attached to mount 4 or integral to flexures 6, and may be of any type, e.g., rotary or linear, so long as actuator 2' moves the retaining portion 8 between the first and second positions. In this way, a segment 13 or contact 15 of retaining portion 8 may be individually controllable by rotation around a joint (substantially at the location where flexure 6 is coupled to mount 4) or by applying a bending moment to a corresponding flexure 6, or in any other useful manner. The segments 13 or contacts 15 may be controlled individually, as selected groups, or in unison. In the embodiment shown, the retaining portion 8 makes contact with an edge or periphery of substrate S, thus minimizing possible damage to IC devices, which are generally situated away from the edge region.

Figure 7:
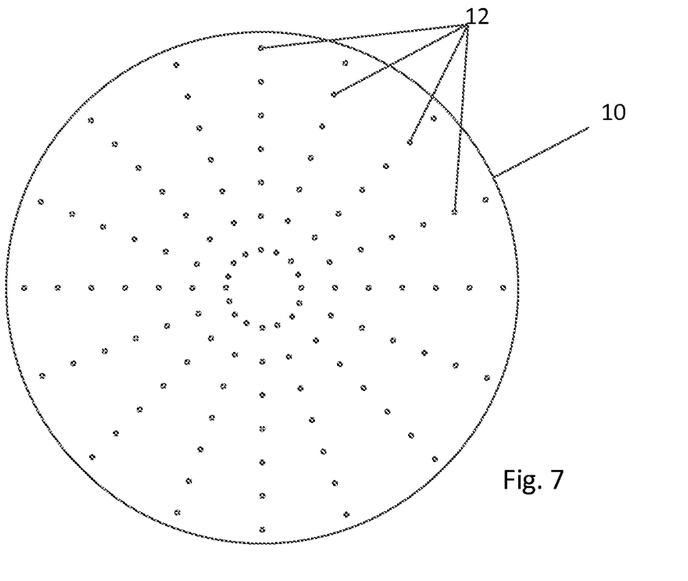
FIG. 7 is a schematic representation of an embodiment of a substrate support having an arrangement of holes in the surface through which air is drawn.

FIG. 7 represents an embodiment of a substrate support 10 wherein holes 12 are arranged in the surface of the substrate support 10. Air is drawn through the holes 12 to produce vacuum pressure between substrate S and support 10, pulling and holding the substrate (not shown) against the support 10. In this embodiment, the holes 12 are arranged circumferentially at various diameters, but the holes 12 may be of any size and arranged in any way that is useful for securing substrate S. Further, porous metallic substrates may be used to form support 10 such that holes 12, such as they are, are randomly distributed. Alternatively, substrate support 10 may be provided with concentric grooves 17 that are coupled to a source of vacuum pressure. Grooves 17 distribute vacuum pressure evenly between a substrate S and the substrate support 10.

Figure 8:
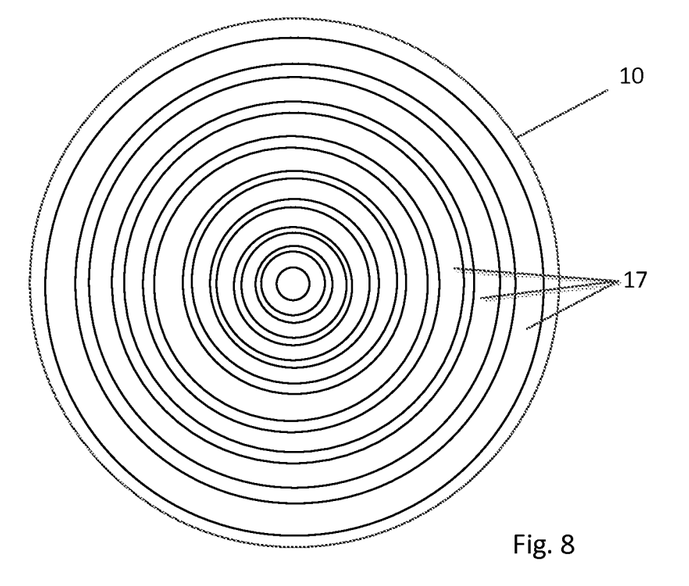
FIG. 8 is a schematic representation of an embodiment of a substrate support having a substrate support with concentric grooves that are coupled to a source of vacuum pressure.
Figure 9:
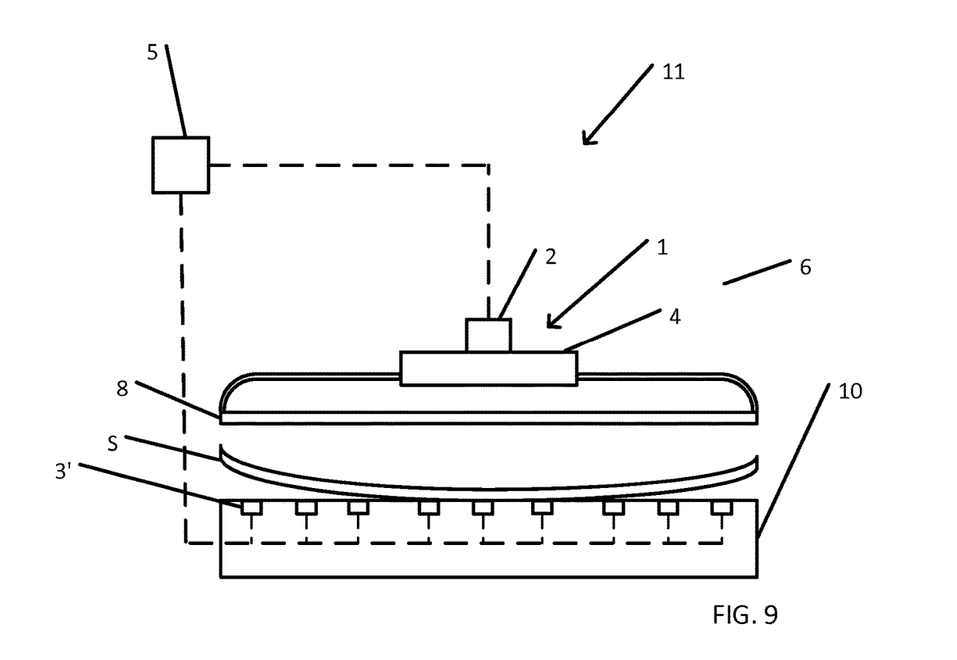
FIG. 9 is a schematic side view of a substrate handler including either of the substrate supports of FIG. 7 or 8, and including sensors disposed in the substrate support.

FIG. 9 represents an embodiment of substrate handling apparatus 11 including either of the embodiments illustrated in FIGS. 7 and 8, or any equivalent structure. Apparatus 11 includes pressure or flow sensors 3' used to determine whether a substrate S has been secured to the support 10. Sensors 3' may be disposed in or on support 10 and coupled to any useful number of holes 12 or grooves 15. In some embodiments only a single sensor 3' is used to determine, overall, whether the substrate S has been successfully secured to the support 10. Where a substrate S has been successfully secured to a support 10, a pressure sensor will reflect an overall vacuum pressure that approaches the magnitude of the source of vacuum pressure. Failure to make good contact between the substrate 10 and the support, for whatever reason, will result in a pressure reading that is lower than that which is provided by the source of vacuum pressure by a predetermined amount. A similar result is achieved using flow meter type sensors to monitor whether the substrate S is secured to the support 10. Where a substrate S is secured to a support 10, the flow of air through the holes 12 or grooves 15 will be reduced to minimal or near zero levels. Accordingly, measured pressure or air flow levels above or below established thresholds, however these values are measured, will indicate that a substrate S is not secured to its support 10. Information about the pressure or flow rate may be processed by on-board processors in the sensor(s). Alternatively, information may be transmitted to controller 5 in wired or wireless communication with sensors 3', which determines what action is to be taken, if any, by apparatus 11.

The controller 5 may receive the pressure or flow rate information and may determine whether to move the retaining portion 8 to its second position in which the substrate S is forced into compliance with the support 10. Note that this determination may be based on an empirically or theoretically pre-determined threshold, e.g., when the airflow or pressure does not satisfy the threshold condition, the retaining portion 8 is actuated. The determination may be based on additional information, including the amount of time during which vacuum is applied between the substrate S and the support 10, and/or the modulus of the substrate S. The controller 5 may also determine whether to actuate the retaining portion 8 based on the nature of the change in pressure or airflow such as the rate at which the measured values change, whether the changes occur in a continuous or discontinuous manner, or whether the measured values tend to fluctuate.

In some embodiments, sensors for measuring airflow or vacuum pressure between a substrate S and a support 10 may be geometrically distributed across the support 10 to provide positional information about where a substrate S is not compliant with the support 10. This positional information may be used in conjunction with the aforementioned information and analysis to determine whether a retaining portion 8 is to be actuated.

CONCLUSION

While various examples were provided above, the present invention is not limited to the specifics of the examples. The apparatus described herein may be used alone or in conjunction with other processing tools or equipment. Furthermore, the apparatus described herein may be used with substrates other than those used in semiconductor processing.

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An apparatus for securing a substrate on a planar support, the apparatus comprising:
   a retaining portion configured to engage the substrate;
   an actuator assembly coupled to the retaining portion and comprising an actuator;
   a sensor configured to detect a physical condition of the substrate that indicates a planarity of the substrate; and
   a controller in signal communication with the sensor and the actuator.

2. The apparatus of claim 1 wherein the controller is configured to receive a signal from the sensor indicating the planarity of the substrate, and wherein the controller is configured to direct the actuator to position the retaining portion to engage the substrate if the planarity is below a predetermined empirically or theoretically derived threshold.

3. The apparatus of claim 1 wherein the sensor is a profilometer configured to measure at least one point on the surface of the substrate.

4. The apparatus of claim 1 wherein the support is configured to retain the substrate using a vacuum pressure drawn between the substrate and the support, and wherein the sensor is configured to detect the vacuum pressure.

5. The apparatus of claim 1 further comprising a flexure to couple the retaining portion to the actuator assembly.

6. The apparatus of claim 1 wherein the retaining portion is configured to engage the periphery of the substrate.

7. The apparatus of claim 1 wherein the retaining portion is a ring.

8. The apparatus of claim 1 wherein the retaining portion comprises a plurality of parts.

9. The apparatus of claim 8 wherein the actuator assembly comprises a plurality of actuators, and wherein each part is configured to be moved by one of the plurality of actuators.

10. A system for retaining a substrate, the system comprising:
   a retaining portion configured to engage the substrate;
   an actuator assembly coupled to the retaining portion and comprising an actuator;
   a sensor configured to detect a physical condition of the substrate that indicates a planarity of the substrate;
   a controller in signal communication with the sensor and the actuator and configured to receive a signal from the sensor indicating the planarity of the substrate and direct the actuator to position the retaining portion to engage the substrate if the planarity is below a predetermined empirically or theoretically derived threshold; and
   a substrate support.

11. The system of claim 10 wherein the substrate support is configured to retain the substrate using a vacuum pressure drawn between the substrate and the support.

12. The system of claim 11 wherein the sensor is configured to detect the vacuum pressure.

13. The system of claim 10 wherein the sensor is a profilometer configured to measure at least one point on the surface of the substrate.

14. The system of claim 10 further comprising a flexure to couple the retaining portion to the actuator assembly.

15. The system of claim 10 wherein the retaining portion is configured to engage the periphery of the substrate.

16. The system of claim 10 wherein the retaining portion is a ring.

17. The system of claim 10 wherein the retaining portion comprises a plurality of parts.

18. The system of claim 17 wherein the actuator assembly comprises a plurality of actuators, and wherein each part is configured to be moved by one of the plurality of actuators.

* * * * *